United States Patent [19]
Jaskolski et al.

[11] 4,050,083
[45] Sept. 20, 1977

[54] INTEGRATED THERMALLY SENSITIVE POWER SWITCHING SEMICONDUCTOR DEVICE, INCLUDING A THERMALLY SELF-PROTECTED VERSION

[75] Inventors: Stanley V. Jaskolski, Sussex; Robert W. Lade, Waukesha; Herman P. Schutten, Elm Grove; Gordon B. Spellman, Mequon, all of Wis.

[73] Assignee: Cutler-Hammer, Inc., Milwaukee, Wis.

[21] Appl. No.: 725,626

[22] Filed: Sept. 22, 1976

[51] Int. Cl.² .................. H01L 23/56; H01L 29/66; H01L 29/74; H01L 29/747
[52] U.S. Cl. .................. 357/28; 361/103; 357/38; 357/39; 307/305; 307/310; 307/252 B; 323/22 SC; 73/362 SC
[58] Field of Search .................. 357/28, 38, 39; 307/305, 310, 252 B, 252 H; 323/22 SC; 317/13 C, 33 C, 41; 340/228; 73/362 SC

[56] References Cited
U.S. PATENT DOCUMENTS

| | | | |
|---|---|---|---|
| 3,564,293 | 2/1971 | Mungenast | 307/252 |
| 3,600,650 | 8/1971 | Obenhaus | 357/28 |
| 3,609,457 | 9/1971 | Squiers | 323/22 C |
| 3,622,849 | 11/1971 | Kelly | 317/33 C |
| 3,708,720 | 1/1973 | Whitney et al. | 357/28 |
| 3,846,674 | 11/1974 | McNulty | 317/13 C |
| 3,920,955 | 11/1975 | Nakata | 307/252 B |
| 3,959,621 | 5/1976 | Nakata | 357/28 |
| 3,962,692 | 6/1976 | Murphy et al. | 357/28 |
| 3,971,056 | 7/1976 | Jaskolski et al. | 357/28 |

*Primary Examiner*—Andrew J. James
*Attorney, Agent, or Firm*—Hugh R. Rather; William A. Autio; Michael E. Taken

[57] ABSTRACT

A monolithic semiconductor device is disclosed comprising a power switching thyristor and a temperature sensitive thyristor integrated on a common substrate. In preferred form, the temperature sensitive thyristor is electrically connected between the gate terminal and one of the main terminals of the power switching thyristor, and is thermally actuatable to intrinsically switch from a high to a low resistance state above a predetermined temperature of the power switching thyristor sensed through the common substrate, whereby to shunt gate current and automatically inhibit turn-on of the power switching thyristor to prevent overheating thereof. Depending on circuit variations, the power switching thyristor may be rendered conductive above or below a predetermined temperature, or within a defined temperature range. Normally off and normally on devices are disclosed.

30 Claims, 21 Drawing Figures

//INTEGRATED THERMALLY SENSITIVE POWER SWITCHING SEMICONDUCTOR DEVICE, INCLUDING A THERMALLY SELF-PROTECTED VERSION

BACKGROUND OF THE INVENTION

Thermally sensitive means exhibiting a continuous or stepless change in resistance, such as thermistors, have been used for controlling the gate signal to a power switch.

A thermally sensitive switch, such as a temperature sensitive thyristor exhibiting a true, abrupt switching characteristic, has been used to shunt the gate of a power switch in response to external heating of the thyristor by a load.

Such devices do not necessarily protect the power switch from thermal breakdown, with the resultant disadvantage of loss of gate control if the load does not thermally trigger the thyristor or thermistor before thermal breakover of the power switch, whereby the power switch loses its blocking ability thereby defeating its protective purpose.

Furthermore, such devices have only been used in discrete circuit form.

SUMMARY OF THE INVENTION

This invention relates to an integrated circuit thermally sensitive power switching semiconductor device, and in preferred form to a power switch with internal thermally sensitive circuitry which monitors the temperatures of the power switch and inhibits electrical gate turn-on when the switch temperatures exceeds a predetermined value, thereby providing thermal overload protection.

An object of the invention is to provide a monolithic semiconductor device comprising a power switch and a temperature switch integrated on a common substrate.

Another object is to provide a device of the aforementioned character wherein the temperature switch is a temperature sensitive thyristor thermally actuatable to intrinsically switch between high and low resistance states in response to a predetermined temperature, and wherein said power switch is a power switching thyristor.

Another object is to provide a device of the aforementioned character wherein the temperature sensitive thyristor is electrically connected to a gate of the power switching thyristor for controlling the conduction state of the latter in response to the temperature of the latter.

A specific object is to provide a device of the aforementioned character wherein the temperature sensitive thyristor is electrically connected between the gate and one of the main terminals of the power switching thyristor such that the temperature sensitive thyristor intrinsically switches from a high to a low resistance state above a predetermined temperature of the power switching thyristor sensed through the common substrate, whereby to shunt gate current and automatically prevent turn-on of the power switching thyristor to prevent overheating thereof, thus affording automatic thermal self-protection.

Another specific object is to provide a device of the aforementioned character wherein the predetermined temperature at which the temperature sensitive thyristor switches is lower than a temperature corresponding to a designated overload temperature of a load in circuit with the power switching thyristor to thereby additionally protect a load from overheating, if desired.

Another specific object is to provide a device of the aforementioned character having three point termination so that it may be substituted pin-to-pin for standard SCR's triacs, etc., without the need of additional or specially adapted wiring or circuitry, whereby to afford not only power switching but also automatic thermal self-protection.

Another specific object is to provide a device of the aforementioned character wherein the gate terminal may be connected to D.C. gate drive whereby to afford latching of the power switching thyristor in its off state when the temperature thereof exceeds said predetermined temperature even if the temperature thereof subsequently falls below said predetermined temperature; and wherein the gate terminal may be connected to A.C. or pulsed D.C. gate drive whereby the power switching thyristor may return to its on state after having been automatically turned off if the temperature thereof subsequently falls below said predetermined temperatures.

Another object of the invention is to provide a device of the aforementioned character and including a second temperature sensitive thyristor having a lower switching temperature than the first mentioned temperature sensitive thyristor and electrically connected in series with the gate of the power switching thyristor, whereby the power switching thyristor is rendered conductive within a defined temperature range, bounded by the switching temperatures of the two temperature sensitive thyristors.

Another object of the invention is to provide a device of the aforementioned character, but having only a temperature sensitive thyristor in series with the gate whereby the power switching thrysitor is rendered conductive above a predetermined temperature.

Another object of the invention is to provide a thermally self-protected monolithic power switching semiconductor device which is normally "on" and can be gated "off."

Another object of the invention is to provide a thermally self-protected monolithic power switching semiconductor device which is normally off and can be gated on.

Other objects and advantages will hereinafter appear.

DESCRIPTION OF THE PREFERRED EMBODIMENT

Figure 1:
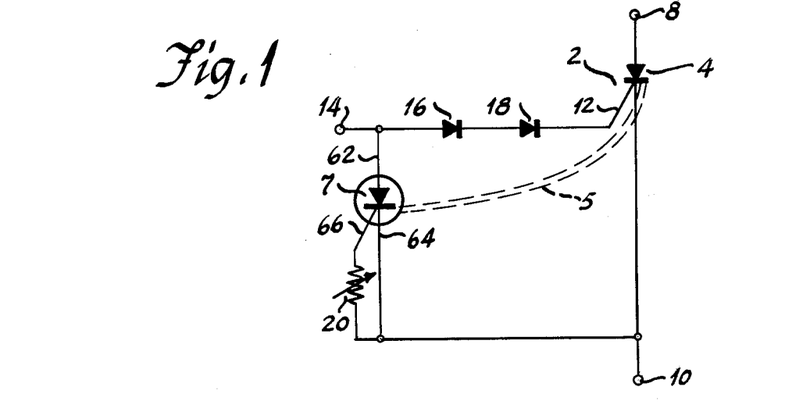
FIG. 1 is a circuit diagram of the preferred embodiment of the present invention.
Figure 2:
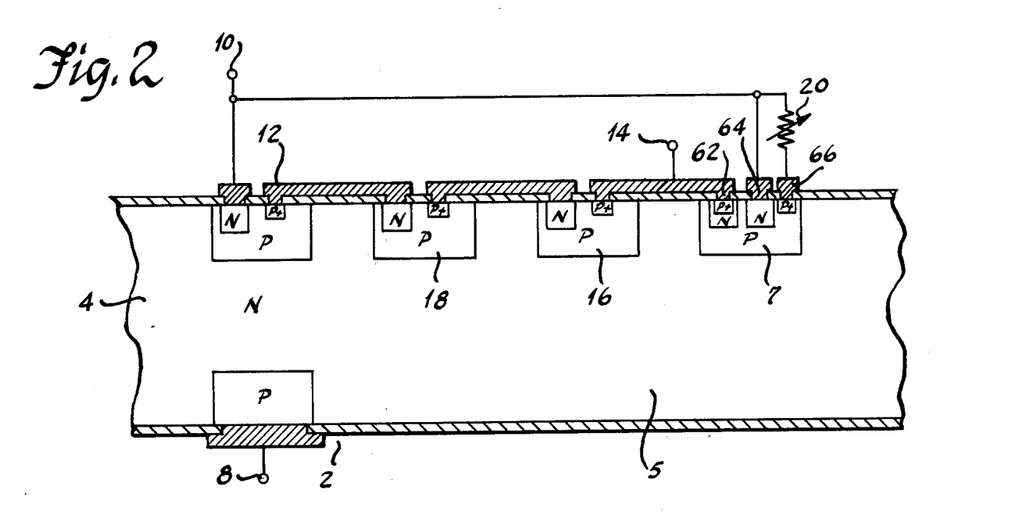
FIG. 2 is an enlarged cross-sectional view of a single chip of silicon showing the components of FIG. 1 integrated therein to form an integrated circuit on a common substrate.

There is shown in FIG. 1 a thermally self-protected power switching semiconductor device, generally designated by the reference character 2. The device comprises a semiconductor power switch 4, such as a triode thyristor or the like, and a semiconductor temperature switch 7, such as a thermally sensitive thyristor. As shown in FIG. 2, the power switch 4 and the temperature switch 7 are integrated on a common substrate 5 of semiconductor material, and thus device 2 is formed on a single chip.

The power switch may be any type of semiconductor device having a high resistance, low current off state and a low resistance, high current on state, whereby to afford a switching characteristic. The power switch has an anode terminal 8 and a cathode terminal 10 for controlling current, to a load for example. A gate 12 is provided for triggering the power switch into conduction in response to a single current applied thereto.

The device further comprises a terminal 14 for applying a signal current to gate 12, and voltage dropping means, such as diodes 16 and 18, in series therewith. Temperature switch 7 is connected in parallel with gate 12, across terminal 14 and cathode 10. A variable resistance 20 may be connected across the cathode and a gate of the temperature switch to vary the switching temperature thereof, as will be more fully described hereinafter.

The temperature switch is thermally actuable to intrinsically switch between high and low resistance states in response to a predetermined switching temperature. Below the switching temperature, switch 7 will be in its high resistance state, so that signal current applied at terminal 14 will flow to gate 12 and trigger power switch 4 into conduction. Above the switching temperature, switch 7 will be in its low resistance state, so that signal current applied at terminal 14 will be diverted through switch 7, due to the voltage drop across diodes 16 and 18, and thus shunt gate 12 whereby to render power switch 4 non-conductive. Since the power switch and the temperature switch are formed on the same chip, the temperature switch will sense the temperature of the power switch and automatically respond thereto and thus protect the power switch against overheating. Device 2 is thus a thermally self-protected power switch integrated circuit semiconductor device.

Operating characteristics of device 2 will be more fully described after the following explanation of the inegration thereof.

Figure 3:
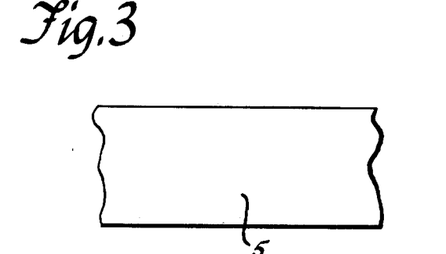
FIGS. 3–14 are schematic cross-sectional views of a substrate sequentially showing the integration of the preferred embodiment of FIGS. 1 and 2 from start to finish, FIGS. 3–11 being of reduced scale.

As shown in FIG. 3, there is first provided a silicon wafer 5, which comprises the common substrate thermally linking the temperature switch and the power switch in heat transfer relation. Other materials, such as germanium, may be used. In the preferred embodiment, this silicon wafer is of N type, has a thickness of about 200 microns and a resistivity of about 50 ohm-cm, though other types and values may be used.

The wafer is first cleaned to remove impurities, particles, etc. One such method is to rinse the wafer in deionized water, followed by a 15 minute ultrasonic bath in sulfuric acid, $H_2SO_4$. The wafer is then rinsed under running deionized water, followed by a 15 minute ultrasonic bath in a solution of ½ sulfuric acid and ½ nitric acid, $HNO_3$. The wafer is then rinsed under running deionized water. One of the purposes of these rinses is to wash away impurities dissolved by the acids. The wafer is next placed in a concentrated solution of hydroflouric acid, HF, to remove oxide layers, and then rinsed under running deionized water. The wafer is then placed in an ultrasonic bath of ½ sulfuric acid and ½ nitric acid for 15 minutes, followed by a thorough rinsing under running deionized water. It can be well appreciated by those in the art that many other types of cleaning methods can be used.

Figure 4:
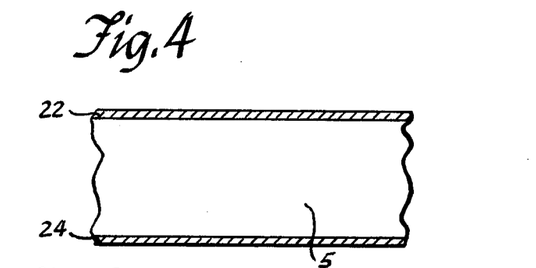

The wafer is then oxidized by placing it in a furnace for 2 hours at a temperature of 1200° C in an atmosphere of oxygen gas and water vapor having a dew point of about 85° C and circulated at a rate of about 2 cubic feet per hour. This forms thin layers of silicon oxide 22 and 24, FIG. 4, on opposing top and bottom faces, respectively, of the wafer. These layers have a thickness of about 7,000 angstroms.

Figure 5:
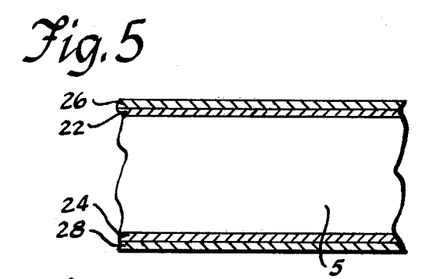

A photosensitive plastic film is formed on both sides of the wafer by applying a photoresist material, and spinning the wafer at 5,000 revolutions per minute for 20 seconds to remove excess photoresist, followed by an 80° C baking for 10 minutes. This results in a wafer, as shown in FIG. 5, having photoresist layers 26 and 28 formed on the silicon oxide layers 22 and 24. The photoresist layers have a thickness of about 14,000 angstroms, or 1.4 microns.

Figure 6:
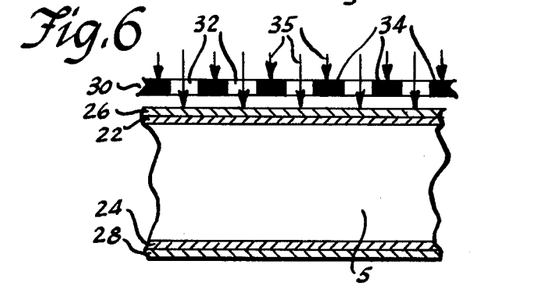

Referring to FIG. 6, the wafer is aligned with a mask 30, which is a photographic plate having a designed pattern formed by clear regions 32 and dark regions 34. Ultra-violet light rays 35 are directed toward the mask as shown in FIG. 6. Dark regions block the transmission of light, while clear regions permit the passage of light rays therethrough. Thus, only those regions of photoresist material 26 which are beneath clear regions of the mask will be exposed to light. Due to the photosensitivity of photoresist material 26, impingement of light thereon will cause polymerization thereof and thus layer 26 will be polymerized only in designed spots, forming a pattern paralleling the pattern of the mask. The bottom side of the wafer is similarly exposed, but with a different mask.

Figure 7:
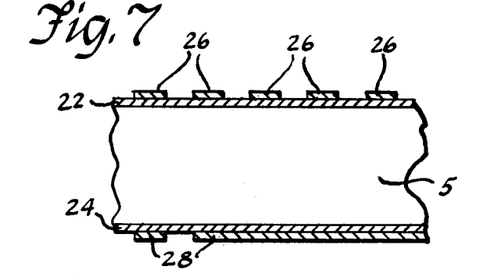

The wafer is next developed with a solvent which dissolves unpolymerized (unexposed) photoresist material, which results in the wafer shown in FIG. 7. The top photoresist layer 26 of FIG. 5 now has holes therein. The bottom layer 28 of FIG. 5 is also dissolved by the solvent where unexposed. The wafer is then baked in air at 120° C for 20 minutes.

Figure 8:
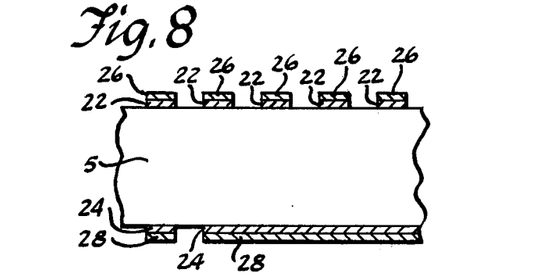

The wafer is then placed in an acid such as a buffered hydrofluoric acid etch and intermittently agitated. The etch dissolves those regions of the oxide layers 22 and 24 which are not protected by the plastic covering provided by the remaining regions of photoresist material, whereby to yield the wafer shown in FIG. 8.

Figure 9:
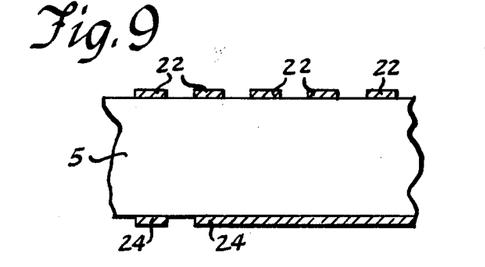

A stripping solution is then applied to the wafer to remove the plastic photoresist material, resulting in the wafer shown in FIG. 9.

The wafer is now cleaned in the manner aforedescribed except that the hydrofluoric acid bath is omitted because it would remove the oxide layers 22 and 24. The wafer is then dried.

Figure 10:
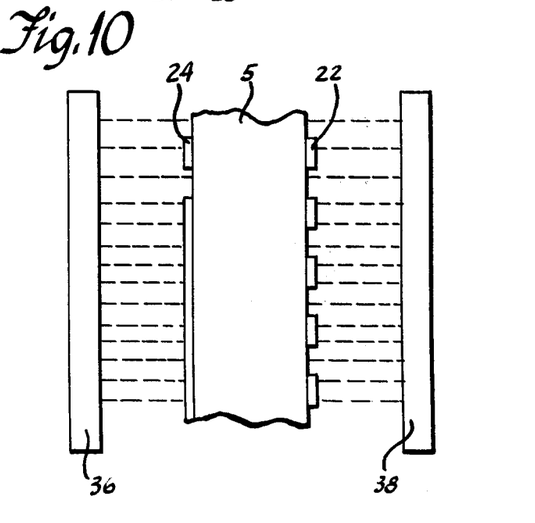
Figure 11:
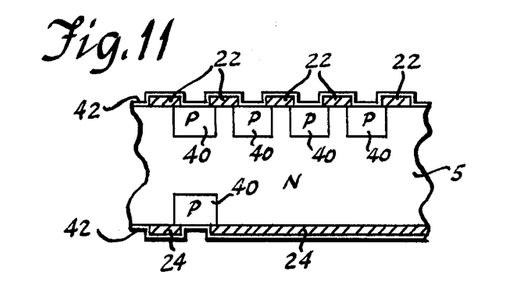

A P type predeposition diffusion is now performed using a source of boron, such as boron nitride with some silicon dioxide. As shown in FIG. 10, the wafer is placed upright between boron sources 36 and 38, and baked in an atmosphere of an inert gas, such as nitrogen, for 1 hour at 850° C. The nitrogen gas is supplied at a rate of 3 cubic feet per hour. The boron tends to evaporate and diffuse to mix with the nitrogen gas and impinge on the wafer, as shown by dotted lines in FIG. 10. This predeposition step leaves shallow layers of P type material in the N type substrate 5 and shallower layers in the oxide layers 22 and 24. The nitrogen gas and the boron wafers are now removed, and a drive-in diffusion is performed by heating the wafer in air at 1200° C for 16 hours to yield the wafer shown in FIG. 11 wherein P type regions 40 are formed in substrate 5 and a thin oxide layer 42 has grown on the faces.

It should be realized that the oxide layers formed by thermal oxidation of silicon, rather than by deposition from dopant sources, form at the silicon-silicon dioxide interface, although for simplicity of illustration all oxides are shown as being added at outer surfaces.

Figure 12:
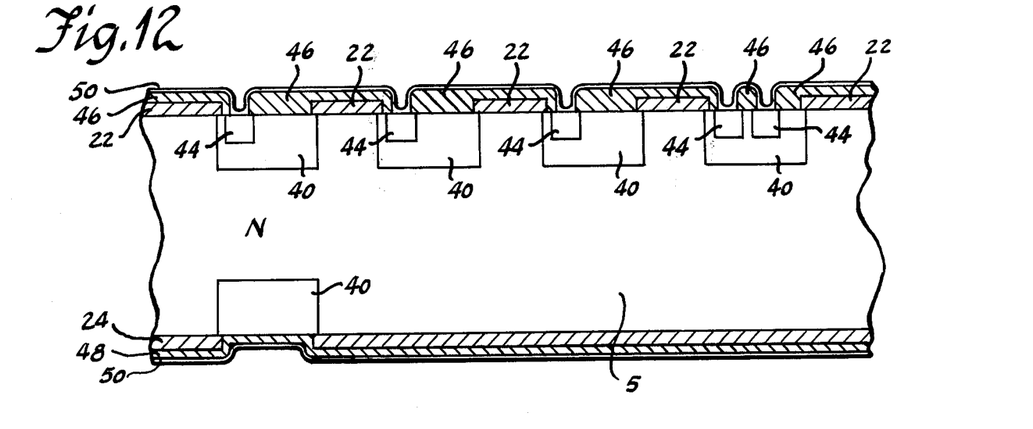

The wafer is now put through a second phase wherein it is again oxidized, applied with photoresist material, masked on the top side with an appropriate mask, exposed, developed, etched, stripped and cleaned, all as aforedescribed. An N type predeposition diffusion in nitrogen at 950° C is then performed as aforedescribed but using a phosphorous source, followed by a drive-in diffusion for 2 hours at 120° C in oxygen with a dew point of 85° C to yield the wafer shown in FIG. 12 wherein N type regions 44 are formed in P type regions 40 according to choice of mask and alignment thereof. Also seen in FIG. 12 are oxide layers 46 and 48 formed during the second oxidation and thin oxide layers 50 formed during the N diffusion.

Figure 13:
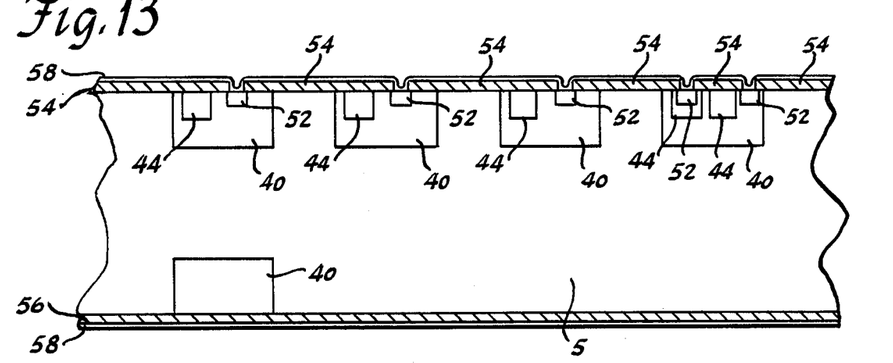

Photoresist material is again applied to the wafer and the top of the wafer is masked, exposed, developed, etched, stripped and cleaned, as aforedescribed. The wafer is then doped by a P+ type diffusion using boron nitride source wafers and baking for 2 hours at 1100° C in an atmosphere of nitrogen supplied at a rate of 3 cubic feet per hour and oxygen supplied at a rate of 0.26 cubic feet per hour. This is followed by a drive-in diffusion for one half hour at 1000° C in an atmosphere of oxygen and water vapor having a dew point of about 85° C; this is not the same type of drive-in diffusion as above, but rather is for the purpose of conditioning the wafer so that it will bond to photoresist material subsequently applied, as hereinafter described. There is thus yielded a wafer as shown in FIG. 13 wherein P+ type regions 52 are formed in P type regions 40 and one of the N type regions 44 according to choice of mask and alignment thereof, together with oxide layers 54 and 56, and thin oxide layers 58, as before.

Photoresist material is then applied to the wafer, and it is masked (pre-ohmic), developed, etched, stripped and cleaned. The wafer is then aluminized by evaporating aluminum in a vacuum chamber onto the faces of the wafer whereby to deposit about a 1 micron film thereon. This is followed by a heating step wherein the wafer is baked for 15 minutes at 500° C in an atmosphere of nitrogen gas supplied at a rate of 5 cubic feet per hour. Enough aluminum diffuses into the wafer to form an electrically conductive connection therewith by forming an ohmic connection. Photoresist material is again applied to the wafer and it is masked and developed. The aluminum is used for ohmic connections to and conduction among the various parts of the wafer. Masking, developing and etching are performed to remove aluminum from designated regions on the wafer and thus the etching is done to remove only aluminum, not photoresist material by means of an etching solution composed of phosphoric acid, nitric acid, acetic acid and water. The remaining photoresist material is stripped, resulting in the wafer shown in FIG. 14 wherein aluminizations 60 are formed on designated regions of the wafer, as shown therein, according to choice of masks and alignment thereof.

While the foregoing integration has been described with great particularity of detail, the scope of the present invention is not to be limited thereto. As will be readily appreciated by those skilled in the art, many variations of such diffusions are possible. Furthermore, while diffusion operations have been described, it is within the scope of the present invention to employ any other type of operation which yields the proper geometry (e.g. layer width), doping and carrier lifetime; some examples of such other operations are epitaxial growth, alloying and ion implantation techniques.

Figure 14:
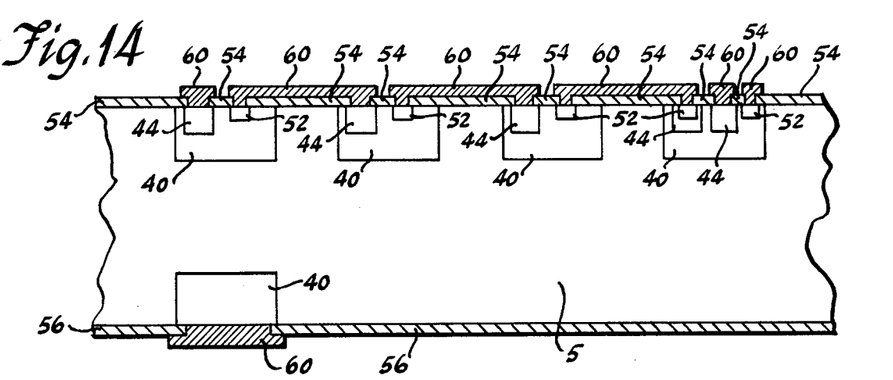

Attachment of conductive leads to the wafer shown in FIG. 14 yields the device shown in FIG. 2 having an anode terminal 8, cathode terminal 10, a terminal 14 for supplying signal current to gate 12, and a variable resistor 20, all as aforedescribed.

Referring to FIGS. 1 and 2, it is seen that the power switch 4 comprises a four layer triode thyristor having a gate 12, which may be triggered by terminal 14 supplying a signal current through diodes 16 and 18. The temperature switch 7 comprises a four layer thyristor thermally actuatable to intrinsically switch between high and low resistance states in response to a predetermined switching temperature. This latter thyristor has an anode 62 and a cathode 64. As taught in Jaskolski et al application Ser. No. 652,192, filed Jan. 26, 1976, and assigned to the assignee of this invention, the switching temperature of such a thyristor is controlled by geometry, doping and carrier lifetime of the layers. The switching temperature may be predetermined by a selected combination of said parameters of geometry, doping and carrier lifetime; and after fabrication of the thyristor, the switching temperature may be varied by the variable resistance 20 connected between a gate 66 and cathode 64 of the thyristor. Gate 66 and resistance 20 are optional. The higher the resistance 20, the lower the switching temperature; no resistance yields the lowest switching temperature.

Although a pair of diodes 16 and 18 are shown, other voltage dropping means may be used provided the voltage drop thereacross is not as great as to reduce the voltage across gate 12 and cathode 10 below that necessary to trigger the power switch into conduction, and at the same time, the sum of the voltage drop across the voltage dropping means and gate 12 must be greater than the voltage drop across the temperature switch 7 in its low resistance state such that the latter may shunt the power switch above the switching temperature.

As an example of an application of device 2, assume an A.C. load and power source are connected in series with the cathode and anode terminals 10 and 8. Without the temperature switch 7, the device 2 performs like an SCR or the like, whereby the load may be energized by application of a signal current to gate 12 to trigger the power switch into conduction. The addition of the temperature switch provides automatic thermal self-protection because the temperature switch senses the temperature of the power switch through the common substrate 5. If the power switch gets too hot, the temperature switch will sense such temperature and intrinsically switch to its low resistance state whereby to shunt the gate 12 due to the lower voltage drop across the temperature switch than across the diodes and the gate. When the temperature switch switches to its low resistance state, the power switch will remain conductive only until the next zero-crossing point in the load voltage cycle, whereby the power switch is automatically turned off and inhibited from being turned back on.

As aforenoted, the switching temperature may be determined by the fabrication of the temperature switch and/or adjustment of variable resistance 20, whereby to select a desired predetermined temperature of the power switch to which the temperature switch will automatically respond by intrinsically switching states. This predetermined temperature is selected less than the thermal breakover temperature of the power switch whereby gate current will be shunted before the power switch loses its current blocking ability.

A feature of device 2, FIGS. 1 and 2, is its three point termination, namely, terminals 8, 10 and 14, whereby the device can be substituted for a standard SCR or the like to provide not only power switching, but also automatic thermal self-protection, without additional circuitry and without modifying the existing circuitry of a specific application. Since device 2 is a single chip integrated circuit, its value as a self-contained modular replacement component can be easily appreciated, especially with such pin-to-pin compatibility.

Device 2 may further be used for load protection if desired, by correlating an overload temperature of a load with a corresponding temperature of the power switch 4 and then setting the switching temperature of the temperature switch 7 so as to switch therebelow. Referring to FIG. 1, assume a load is connected in series with power switch 4 and controlled by the conduction state of the power switch. Overload current through and the load also flows through the power switch thereby raising the temperature of the latter. The temperature switch 7 senses this raised temperature and responds thereto by switching to its low resistance state and thereby cut-out the load before excessive overheating thereof. The switching temperature of switch 7 may be preselected and/or adjusted, as aforenoted.

A feature of device 2 is the latching thereof when D.C. gate drive is used. If an A.C. load is in series with terminals 8 and 10, and the temperature of the power switch exceeds a predetermined value, the temperature switch will automatically respond thereto by shunting the gate 12 to turn off the power switch. Even if the temperature subsequently falls below the switching temperature, switch 7 will remain conductive because of the steady D.C. current flowing therethrough from terminal 14. The power switch thus remains latched off because signal current is continually shunted from gate 12, i.e. the power switch will conduct only during the remainder of the A.C. cycle before the load voltage passes through zero, and remain latched off thereafter. Device 2 must be externally reset before the power switch 4 can be rendered conductive again.

A.C. gate drive or pulsed D.C. gate drive do not afford latching, but rather permit the power switch to be automatically rendered conductive again after the temperature falls below the predetermined temperature. When the temperature switch 7 switches into conduction in response to a predetermined temperature of power switch 4, the temperature switch will remain conductive as long as the temperature thereof is above the switching temperature, thereby shunting gate 12 and rendering the power switch nonconductive. If, however, the temperature falls below the switching temperature, the temperature switch will remain conductive only until the A.C. or pulsed D.C. voltage applied at terminal 14 returns to or passes through zero during its cycle, after which the temperature switch switches to its high resistance state thereby blocking current flow therethrough, and diverting signal current to gate 12 to thereby retrigger the power switch into conduction. Thus, when an A.C. or a pulsed D.C. gate drive is used with device 2, a load may automatically be deenergized above a certain temperature and automatically reenergized below that temperature.

As used in the art, some power switches have what may be called a non-sensitive gate wherein the switch is triggered by current in the range of perhaps 10 to 100 milliamps; and some power switches have what may be called a sensitive gate wherein the switch is triggered by a smaller current, perhaps in the range 0.1 to 10 milliamps. A common method of obtaining a non-sensitive gate power switch is to short the gate and cathode thereof internally of the switch; and, for example, to delete such short if a sensitive gate is desired. The present invention is easily adaptable to such techniques, as will be recognized by those skilled in the art, as well as other well-known engineering techniques used for adapting a power switch to particular circuit requirements and ratings, etc.

Figure 15:
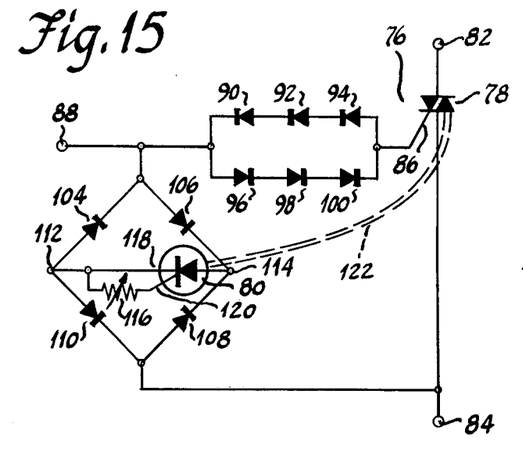
FIG. 15 is a bilateral version of FIG. 1.
Figure 16:
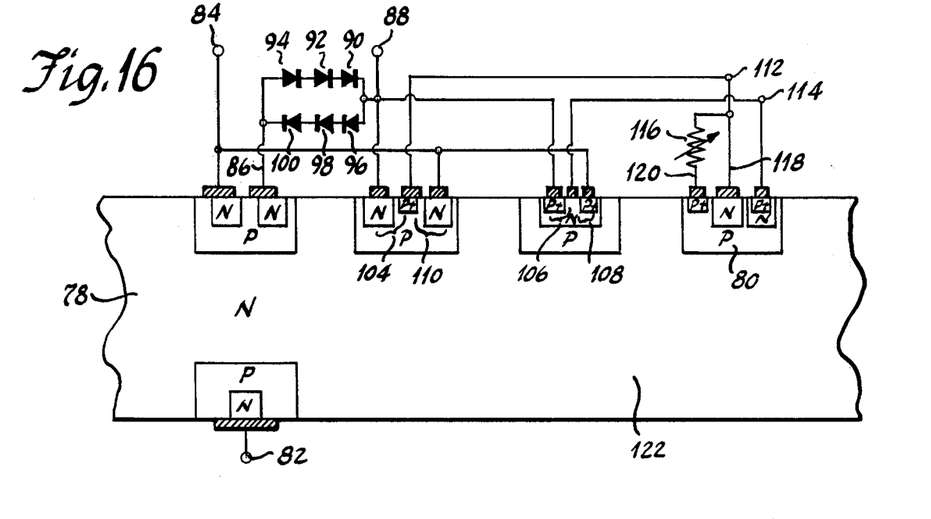
FIG. 16 is a bilateral version of FIG. 2.

The present invention also encompasses a bilateral version 76 of device 2, as shown in FIGS. 15 and 16. FIG. 15 shows in circuit form a bilateral thermally self-protecting power switching integrated circuit semiconductor device 76, and FIG. 16 shows a substrate form of the device, except that voltage dropping diode integration has not been shown for clarity of illustration.

Referring to FIG. 15, device 76 comprises a power switch 78 and a temperature switch 80. Switch 78 is a bilateral power switch, such as a bilateral triode thyristor (triac) or the like, having line terminals 82 and 84 for connection to a load and power source, for example, and a gate 86 for triggering the power switch into conduction. A terminal 88 is provided for applying signal current to gate 86, and voltage dropping means are connected in series between terminal 88 and gate 86, such as diodes 90, 92 and 94 in anti-parallel relation to diodes 96, 98 and 100. As before, such voltage dropping means, if needed at all, are provided to insure proper shunting of gate 86 above a predetermined temperature, and thus many variations thereof are possible in accordance with well known principles in the art. Device 76 includes a rectifier bridge comprised of diodes 104, 106, 108, 110, in a configuration well known in the art as shown in FIG. 15. The inputs of the bridge are connected between terminal 88 and line terminal 84. The temperature switch is connected between the D.C. outputs 112 and 114 of the bridge and may include a variable resistor 116 connected across a cathode 118 and gate 120 thereof for varying the switching temperature, as before.

As seen in FIG. 16, temperature switch 80 and power switch 78 are integrated on common substrate 122, whereby the temperature switch senses the temperature of the power switch and automatically responds thereto by shunting gate current above a predetermined temperature, as aforedescribed. The device shown in FIG. 16, wherein the oxide layers have been omitted for clarity of illustration, may be formed in accordance with the principles aforetaught. Furthermore, the invention is not to be limited to a particular substrate formation or configuration, as many variations are possible which incorporate a semiconductor temperature switch and a semiconductor power switch on a common substrate to afford a thermally self-protecting bilateral power switching semiconductor device.

Figure 17:
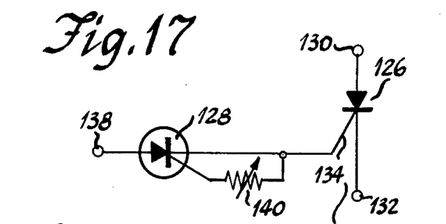
FIG. 17 is a circuit diagram of an alternate embodiment of the present invention.

An alternative embodiment of the invention is shown in FIG. 17 wherein a thermal turn-on device 124 comprises a power switch 126 and a temperature switch 128. The power switch includes an anode terminal 130 and a cathode terminal 132 for carrying a load current, and a gate 134 for triggering the power switch into conduction. Temperature switch 128 is electrically connected in series with gate 134 through the temperature switch. A variable resistor 140 may be connected across a cathode and a gate of the temperature switch for varying the switching temperature thereof. Device 124 thus is a thermally sensitive power switching device which is conductive above a predetermined temperature and non-conductive therebelow, i.e. below the switching temperature the temperature switch will be in its high resistance state whereby to block current flow from terminal 138 to gate 134 and thus not allow power switch 126 to be triggered into conduction; however, above the switching temperature, the temperature switch will be in its low resistance state whereby to permit current flow to gate 134 and render the power switch conductive. Device 124 may be integrated on a common substrate according to the principles hereinbefore taught, to form a single chip, which, for example, may be placed in an environment for conduction above a predetermined temperature of the environment sensed by the chip.

It is to be noted that the teachings regarding sensitive gate, a bilateral version, etc., as hereinbefore described, are equally applicable to the device of FIG. 17.

Figure 18:
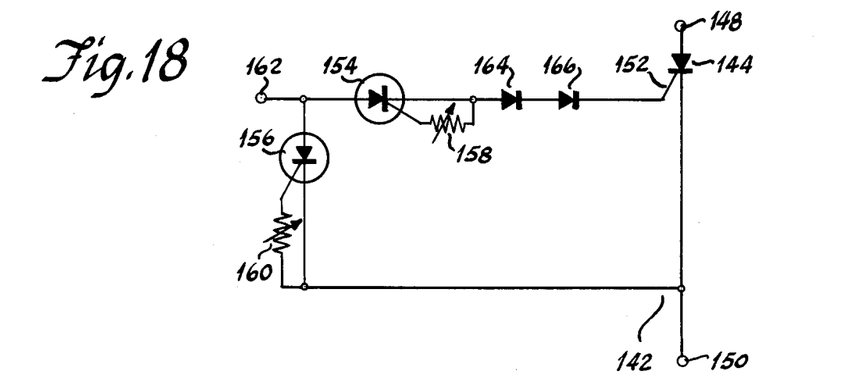
FIG. 18 is a circuit diagram of an alternate embodiment of the present invention.

Another alternate embodiment of the invention is shown in FIG. 18 wherein a thermal turn-on and turn-off device 142 comprises a power switch 144 and two temperature switches 154 and 156. As before the power switch has anode and cathode terminals 148 and 150, and a gate 152. Temperature switch 154 is in series with gate 152, and temperature switch 156 in parallel. Variable resistors 158 and 160 may be provided to vary the switching temperatures of the temperature switches. A terminal 162 is provided for applying a signal current, and if necessary, voltage dropping means, such as diodes 164 and 166, may be provided. Temperature switch 154 has a switching temperature $T_1$ lower than the switching temperature $T_2$ of temperature switch 156. In view of the aforetaught principles, it is thus seen that below $T_1$, the power switch will be in its non-conducting state because switch 154 is in its high resistance state; between $T_1$ and $T_2$, the power switch will be in its conducting state because switch 154 is in its low resistance state and switch 156 is in its high resistance state; and above $T_2$, the power switch will be in its non-conducting state because switch 156 is in its low resistance state. That is, at $T_1$, the power switch is triggered into conduction because switch 154 allows signal current to flow therethrough from terminal 162 to gate 152; and at $T_2$, switch 156 shunts gate 152 whereby to turn-off the power switch. It is thus seen that device 142 may be used when it is desired to energize a load only within a defined temperature range, i.e. the power switch will be off below $T_1$, on between $T_1$ and $T_2$, off above $T_2$.

Device 142 may be totally integrated on a single chip according to the principles aforetaught, or may be only partially integrated such that, for example, power switch 144 and temperature switch 156 are on the same chip but temperature switch 154 is discrete therefrom.

The embodiments hereinbefore disclosed are commonly called "normally off" switches because the device normally blocks load current until gated on. The present invention also encompasses "normally on" devices wherein the switch normally conducts load current until gated off, as will presently be described.

Figure 19:
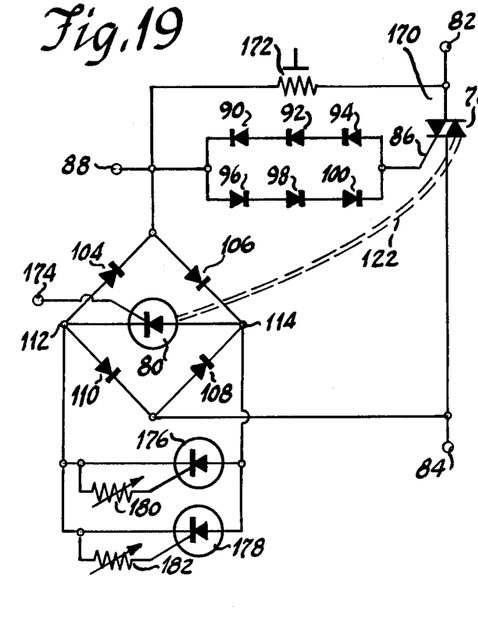
FIG. 19 is a variation of FIG. 15.
Figure 20:
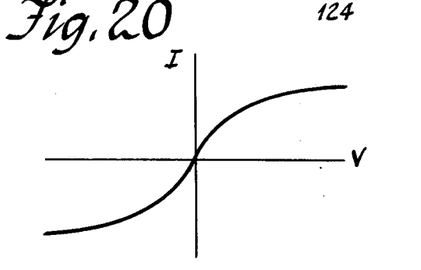
FIG. 20 is a voltage-current curve of a buried FET pinch resistor.

There is shown in FIG. 19 a normally on power switching device 170, wherein like reference numerals from FIG. 15 are used for corresponding parts. Gate terminal 88 is connected to main terminal 82 through current saturation means such as buried FET pinch resistor 172. This current saturation means is known in the art and is like that described in the textbook "Analog Integrated Circuit Design" by Alan B. Grebene, Van Nostrand Reinhold Company, 1972, pp. 104–108. Current saturation means have a voltage-current characteristic like that shown in FIG. 20 whereby to allow current flow therethrough as the voltage rises at the beginning of its cycle but limiting the amount of current therethrough at higher voltages in the cycle to prevent excessive gate current. Power switch 78 is thus substantially continually gated into conduction by line current flowing through current saturation means 172 and diodes 90–100, whereby device 170 is normally on.

Device 170 may be gated off by a signal current applied to gate 174 of temperature sensitive thyristor 80 to trigger the latter into conduction and shunt gate current away from gate 86 of the power switching thyristor whereby the latter will conduct only during the remainder of the cycle until zero-crossing of the link voltage whereafter it will be non-conductive. As before, power switch 78 and temperature sensitive thyristor 80 of device 170 are integrated on a common substrate such as 122, FIG. 16. The other components of device 170 may be integrated as desired.

Device 170 has a wide variety of applications in temperature control systems, for example, it may be used as a thermostat. Additional temperature sensitive thyristors 176 and 178, FIG. 19, may each be connected in parallel with thyristor 80 across the D.C. outputs 112 and 114 of the rectifying diode bridge. Temperature sensitive thyristors 176 and 178 may be like that disclosed in said Jaskolski et al Application or in Jaskolski et al U.S. Pat. No. 3,971,056, issued July 20, 1976, and assigned to the assignee of this invention, whereby to afford selectable predetermined switching temperatures as low as −55° C for germanium and −30° C for silicon. Variable resistances 180 and 182 may be used to vary the switching temperatures of thyristors 176 and 178, respectively. Thyristor 178 may, for example, be placed adjacent furnace and thyristor 176 be placed in a room to be heated. The furnace ignition is connected across main terminals 82 and 84 and is energized when each of the thyristors 80, 176 and 178 is in its high resistance state whereby gate current from the line through pinch resistor 172 to gate 86. If any of the thyristors 80, 176 and 178 intrinsically switches to its low resistance state in response to temperature, however, gate current will be diverted therethrough and power switch 78 will be rendered non-conductive. Thyristor 176 thus turns the furnace off when the room temperature has reached desired level. Thyristor 178 senses the temperature of the furnace itself to protect the furnace by cutting off power thereto when it gets too hot. Multiple parallel sensors can be used if desired. Thyristor 80 protects power switch 78 as before. Other temperature sensitive thyristors can be added and other circuit variations are of course possible to provide numerous types of temperature control systems, all having automatic thermal self-protection because of the monolithic integration of thyristor 80 and power switch 78.

Figure 21:
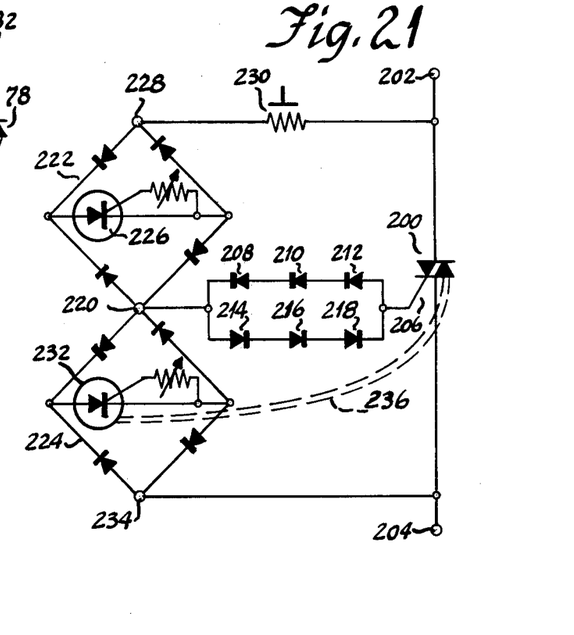
FIG. 21 is a modification and bilateral version of FIG. 18.

A "normally off" switch may also be gated from the line. Using device 142, FIG. 18, as an example, FIG. 21 shows a variation there which is bilateral and gated from the line, and may be used, for example, for refrigeration control. A power switch, such as triac 200, has main terminals 202, 204 and a gate 206 connected through antiparallel diodes 208, 210, 212, 214, 216 and 218 to the junction 220 of rectifying diode bridges 222 and 224. A temperature sensitive thyristor 226 is connected across the D.C. outputs of bridge 222, one of the A.C. inputs being point 220 and the other A.C. input 228 is connected through buried FET pinch resistor 230 to main terminal 202. A temperature sensitive thyristor 232 is connected between the D.C. outputs of bridge 224, one of the A.C. inputs being point 220 and the other A.C. input 234 is connected to main terminal 204. Thyristor 232 is monolithically integrated on a common substrate 236 with triac 200 to provide automatic thermal self-protection as before, and the remaining components may also be integrated therewith if desired. The device of FIG. 21 is normally off, but when the temperature of a refrigerated compartment, for example, exceeds a designated value, thyristor 226, placed therein, will intrinsically switch to its low resistance state whereby to allow current to flow to gate 206 and trigger the triac into conduction and, for example, energize a compressor connected in series with main terminals 202 and 204. Thyristor 232 protects the triac, and the compressor if desired, from overloading.

It is recognized that modifications of the embodiments disclosed are possible within the scope of the invention claimed.

We claim:

1. A monolithic semiconductor device comprising on a common substrate a plurality of junctions of opposite conductivity type regions, at least one of said junctions being a power switching junction having a current blocking off state and a current passing on state whereby to exhibit a current switching characteristic, at least another of said junctions being a temperature sensitive junction thermally actuatable to intrinsically switch between high and low resistance states in response to a predetermined temperature of said power switching junction sensed through said substrate, said predetermined temperature being less than the thermal breakover temperature of said power switching junction.

2. The device according to claim 1 wherein said temperature sensitive junction is electrically connected to one of the regions forming said power switching junction to control the conduction state of the latter in response to temperature.

3. The device according to claim 1 comprising:
a first set of first, second, third and fourth successively contiguous regions of alternating conductivity type forming first, second and third junctions, said second junction being the middle junction formed by the interface of said second and third regions, said second junction being said power switching junction; and a second set of first, second, third and fourth successively contiguous regions of alternating conductivity type forming first, second and third junctions, said second junction of said second set being the middle junction formed by the interface of said second and third regions, said second junction of said second set being said temperature sensitive junction; said second region of said first set being of opposite conductivity type from and forming a junction with said third region of said second set, said last mentioned junction separating said power switching junction from said temperature sensitive junction.

4. The device according to claim 3 wherein said first region of said second set is electrically connected to said third region of said first set, and further comprising a gate current carrying terminal electrically connected to said first region of said second set and said third region of said first set;

such that said temperature sensitive junction switches to said low resistance state in response to said predetermined temperature of said power switching junction sensed through said second region of said first set and said third region of said first set whereby to shunt said third region of said first set such that gate current from said terminal flows through said second set of junctions to thereby inhibit gate turn-on of said power switching junction; and such that when the temperature of said power switching junction is below said predetermined temperature, said temperature sensitive junction is in said high resistance state such gate current from said terminal flows to said third region of said first set to enable gate turn-on of said power switching junction.

5. The device according to claim 4 wherein said fourth region of said second set is electrically connected to said fourth region of said first set, and further comprising one or more pairs of contiguous opposite conductivity type regions each forming a voltage dropping junction and electrically connected in series between said third region of said first set and the electrical junction of said terminal and said first region of said second set, the sum of the voltage drops across the junctions formed by said third and fourth regions of said first set and by said one or more pairs of regions being greater than the sum of the voltage drops across said first, second and third junctions of said second set when said temperature sensitive junction is in said low resistance state, whereby to assure said shunting of said third region of said first set when said power switching junction exceeds said predetermined temperature, the voltage drop across said one or more pairs of regions being less than a value which would reduce the voltage drop across said junction formed by said third and fourth regions of said first set below that necessary to gate said power switching junction into said current passing on state.

6. A semiconductor device comprising a power switch and a temperature switch integrated on a common substrate, said power switch having a current blocking off state and a current passing on state and including a gate electrically connected to said temperature switch, said temperature switch being thermally actuatable to intrinsically switch between high and low resistance states whereby to control the conduction state of said power switch in response to temperature.

7. The device according to claim 6 wherein said power switch is a power switching thyristor and wherein said temperature switch is a temperature sensitive thyristor.

8. The device according to claim 7 wherein said power switching thyristor has a pair of main terminals for carrying load current, and further comprising a gate terminal electrically connected to said gate for carrying signal current to said power switching thyristor to trigger the latter into said current passing on state.

9. The device according to claim 8 wherein said temperature sensitive thyristor is electrically connected in parallel with said gate between said gate terminal and one of said main terminals such that said temperature sensitive thyristor intrinsically switches from said high to said low resistance state in response to a predetermined temperature of said power switching thyristor sensed through said common substrate to thereby shunt said signal current and automatically inhibit turn-on of said power switching thyristor above said predetermined temperature, said predetermined temperature being less than the thermal break-over temperature of said power switching thyristor.

10. The device according to claim 9 further comprising voltage dropping means electrically connected in series between said gate and the junction of said temperature sensitive thyristor and said gate terminal, the sum of the voltage drops across said gate and said voltage dropping means being greater than the voltage drop across said temperature sensitive thyristor in said low resistance state to thereby insure said shunting of said signal current when the temperature of said power switching thyristor exceeds said predetermined temperature, the voltage drop across said voltage dropping means being less than a value which would reduce the voltage across said gate below that necessary to trigger said power switching thyristor into conduction; such that said signal current flows to said gate when said power switching thyristor is below said predetermined temperature and such that said signal current flows through said temperature sensitive thyristor when said power switching thyristor is above said predetermined temperature.

11. The device according to claim 10 wherein said voltage dropping means comprises one or more diodes integrated on said substrate.

12. The device according to claim 9 further comprising a load and a source of electric power connected in series with said main terminals and wherein said predetermined temperature of said power switching thyristor is lower than a temperature thereof which would correspond to a designated overload temperature of said load, whereby to protect said load from overheating.

13. The device according to claim 9 wherein said gate terminal is adaptable for connection to D.C. gate drive whereby to afford latching of said power switching thyristor in said off state when the temperature thereof exceeds said predetermined temperature even if the temperature thereof subsequently falls below said predetermined temperature.

14. The device according to claim 9 wherein said gate terminal is adaptable to A.C. or pulsed D.C. gate drive whereby to afford retriggering of said power switching thyristor into said on state after the temperature thereof has risen above and then fallen below said predetermined temperature.

15. The device according to claim 10 wherein said power switching thyristor comprises a unilateral triode thyristor, said temperature sensitive thyristor is unilateral with an anode connected to said gate terminal and a cathode connected to the cathode of said power switching thyristor.

16. The device according to claim 15 further comprising a variable resistance connected between a gate and cathode of said temperature sensitive thyristor for ajustably varying the switching temperature thereof.

17. The device according to claim 10 wherein said power switching thyristor comprises a bilateral triode thyristor.

18. The device according to claim 17 wherein said voltage dropping means comprises two or more antiparallel diodes.

19. The device according to claim 17 further comprising a rectifying bridge having its inputs connected between said gate terminal and said one main terminal and its outputs connected across said thermally sensitive thyristor.

20. The device according to claim 9 having three point termination, said points being said gate terminal and said pair of main terminals, whereby to afford a single chip modular replacement device substitutable for standard power switches to provide not only power switching but also automatic thermal self-protection.

21. The device according to claim 8 wherein said temperature sensitive thyristor has an anode, cathode and gate, and further comprising a variable resistance connected between said last mentioned gate and said cathode for adjustably varying the switching temperature of said temperature sensitive thyristor.

22. The device according to claim 8 wherein said temperature sensitive thyristor is electrically in series with said gate between said gate and said gate terminal such that said signal current flows to said gate only above a predetermined temperature of said substrate sensed by said temperature sensitive thyristor.

23. The device according to claim 9 further comprising a second temperature sensitive thyristor having a switching temperature lower than said first mentioned temperature sensitive thyristor and connected in series with said gate, whereby said signal current can flow to said gate to trigger said power switching thyristor into said on state only within a defined temperature range corresponding by bounded by the switching temperatures of said temperature sensitive thyristors.

24. The device according to claim 9 wherein said gate terminal is connected to the other of said main terminals through current saturation means such that said signal current is derived from a power source connected to said main terminals.

25. The device according to claim 24 wherein said temperature sensitive thyristor has a gate for triggering said temperature sensitive thyristor into conduction independently of said temperature responsive intrinsic switching.

26. The device according to claim 24 further comprising a second temperature sensitive thyristor connected in series with said current saturation means between said other main terminal and said gate.

27. The device according to claim 9 further comprising one or more additional temperature sensitive thyristors each connected in parallel with said first mentioned temperature sensitive thyristor.

28. The device according to claim 19 wherein said gate terminal is connected to the other of said main terminals through current saturation means.

29. The device according to claim 28 further comprising one or more additional temperature sensitive thyristors each connected in parallel with said first mentioned temperature sensitive thyristor.

30. The device according to claim 19 further comprising: a second rectifying bridge having its inputs connected between said gate terminal and the other of said main terminals;

current saturation means in series with said second bridge;

and a second temperature sensitive thyristor connected between the outputs of said second bridge.

* * * * *